United States Patent [19]
Fujii

[11] Patent Number: 5,172,073
[45] Date of Patent: Dec. 15, 1992

[54] AMPLIFYING CIRCUIT
[75] Inventor: Takashi Fujii, Tokyo, Japan
[73] Assignee: NEC Corporation, Tokyo, Japan
[21] Appl. No.: 846,374
[22] Filed: Mar. 5, 1992
[30] Foreign Application Priority Data Mar. 15, 1991 [JP] Japan ................................. 3-50927

[51] Int. Cl.[5] .............................................. H03F 3/16
[52] U.S. Cl. .................................... 330/255; 330/260;
330/267
[58] Field of Search ............... 330/260, 255, 267, 268,
330/51, 261

[56]   References Cited
U.S. PATENT DOCUMENTS

| | | | |
|---|---|---|---|
| 4,866,398 | 9/1989 | Gulczynski | 330/255 |
| 4,888,559 | 12/1989 | Sevenhans et al. | 330/255 |
| 4,931,797 | 6/1990 | Kagawa et al. | 330/260 |
| 4,963,837 | 10/1990 | Dedic | 330/255 |

OTHER PUBLICATIONS

A Highly Linear CMOS Buffer Amplifier, Fisher et al, IEEE Journal of Solid-State Circuit, vol. SC-22, No. 3, Jun. 1987.
Transconductance Amplifiers, K. Lewiss, Electronic & Wireless World, Jun. 1987.

Primary Examiner—Eugene R. LaRoche
Assistant Examiner—Tan Dinh

[57]  ABSTRACT

At the time of driving no load, a non-inverted input of a differential amplifier is switched from an output terminal to a reference voltage source. Thus, a constant current source circuit consisting of the reference voltage source, the differential amplifier, and an output stage transistor is provided to control an idling current flowing through output stage transistors to an appropriate level.

6 Claims, 6 Drawing Sheets

AMPLIFYING CIRCUIT

FIELD OF THE INVENTION

The invention relates to an amplifying circuit, and more particularly to, an amplifying circuit for driving a load of a low impedance.

BACKGROUND OF THE INVENTION

One type of a conventional amplifying circuit for driving a low impedance load is described in a report titled "MOS Operational Amplifier Design—A Tutorial Overview" of "IEEE Journal of Solid-State Circuit, Vol. SC-17, No.6, December 1982". The conventional amplifying circuit comprises two differential amplifiers each amplifying a difference between one input signal and a signal fed-back from an output terminal, and two output stage transistors having sources connected to a power supply and ground, respectively, to be driven by the differential amplifiers.

The conventional amplifying circuit has an advantage in that a range of an output voltage can be wide as compared to an amplifying circuit using a source follower circuit at an output stage.

However, the conventional amplifying circuit has a disadvantage in that an idling current flowing through the output stage transistors is largely fluctuated, when the two differential amplifiers are supplied with an input offset voltage.

For the purpose of overcoming this disadvantage, the other type of a conventional amplifying circuit is proposed as described in a report titled "A 1.544 Mb/s CMOS Line Driver for 22.8 Ohm Load" of "IEEE Journal of Solid-State Circuits, Vol. SC-25, No.3, June, 1990". In this conventional amplifying circuit, an idling current flowing through output stage transistors is controlled to be increased or decreased by two negative feed-back amplifiers which are connected to outputs of two differential amplifiers, respectively.

However, this conventional amplifying circuit has disadvantages in that it is difficult to control the idling current with a predetermined precision, because the idling current is determined at the time of no load by amplification factors of the differential and negative feedback amplifiers and an input offset voltage of the differential amplifier, and in that the design is difficult on some points as described later.

SUMMARY OF THE INVENTION

Accordingly, it is an object of the invention to provide an amplifying circuit in which an idling current flowing through the output stage transistors is not fluctuated.

It is a further object of the invention to provide an amplifying circuit in which an idling current flowing through the output stage transistors is well controlled at the time of no load to decrease current consumption and to avoid cutting-off of the output transistors.

It is a still further object of the invention to provide an amplifying circuit, the design of which is carried out without difficulties.

According to the invention, an amplifying circuit, comprises;

a first differential amplifier having an inverted input connected to an input terminal and a non-inverted input connected to an output terminal;

a first output stage transistor connected at a gate to an output of the first differential amplifier, at a source to a power supply, and at a drain to the output terminal;

a second differential amplifier having an inverted input connected to said input terminal and a non-inverted input terminal connected to the output terminal;

a second output stage transistor connected at a gate to an output of the differential amplifier, at a source to ground, and at a drain to the output terminal;

first switching means for switching a connection of the non-inverted input of the first differential amplifier from the output terminal to a reference voltage source; and second switching means for switching a connection of the inverted input of the first differential amplifier from the input terminal to the output of the first differential amplifier.

BRIEF DESCRIPTION OF THE DRAWINGS

The invention will be explained in more detail in conjunction with appended drawings, wherein.

DESCRIPTION OF THE PREFERRED EMBODIMENTS

Before explaining an amplifying circuit of a first preferred embodiment according to the invention, the aforementioned first and second conventional amplifying circuit will be explained in FIGS. 1 and 2.

Figure 1:
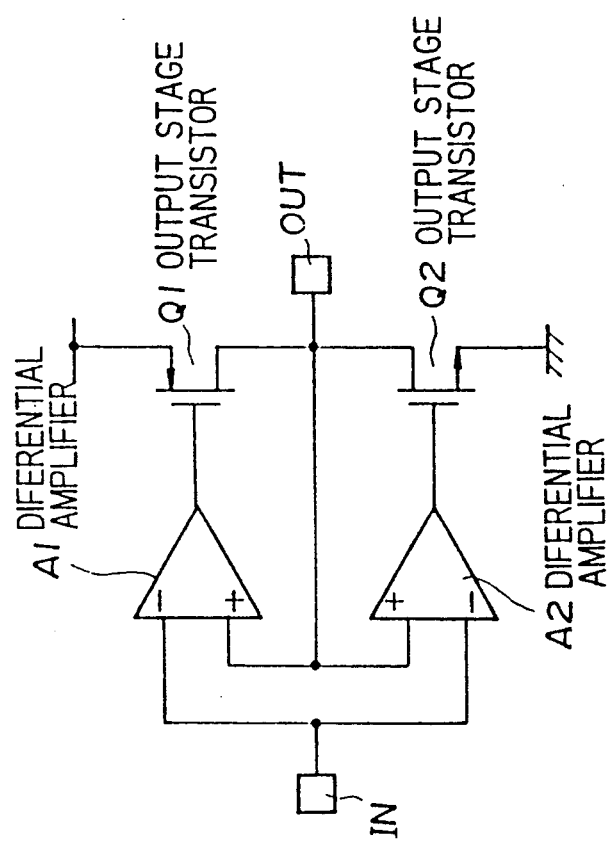
FIG. 1 is a circuit diagram of a first conventional amplifying circuit.

FIG. 1 shows the first conventional amplifying circuit which comprises differential amplifiers A1 and A2, and output stage transistors Q1 and Q2. In this amplifying circuit, inverted terminals of the amplifying circuits A1 and A2 are connected to an input terminal IN, non-inverted terminals thereof are connected to an output terminals OUT,. and outputs thereof are connected to gates of the transistors Q1 and Q2, respectively. Drains of the transistors Q1 and Q2 are connected to the output terminal which is a common point connected to the non-inverted terminals of the differential amplifiers A1 and A2, a source of the transistor Q1 is connected to a power supply, and a source of the transistor Q2 is connected to ground.

In this amplifying circuit, the output stage transistors Q1 and Q2 are driven by the differential amplifiers A1 and A2. As described before, a range of an output voltage obtained at the output terminal OUT can be wide as compared to an amplifying circuit utilizing a source follower circuit for an output stage. For this reason, the first conventional amplifying circuit is widely used.

In the first conventional amplifying circuit, however, an idling current flowing through the output stage transistors Q1 and Q2 is largely fluctuated, when an input offset voltage is applied to the differential amplifiers A1 and A2. If it is assumed that a positive input offset voltage is applied to the differential amplifier A1, and a negative input offset voltage is applied to the differential amplifier A2, respectively, under the condition that a polarity of the input offset voltage is determined on the basis of the non-inverted input, an output signal of the differential amplifier A1 swings in the direction of the ground potential, while an output signal of the differential amplifier A2 swings in the direction of the power supply voltage. As a result, the idling current is largely increased to increase the consumption of current. On the other hand, if it is assumed that a negative input offset voltage is applied to the differential amplifier A1, and a positive input offset voltage is applied to the differential amplifier A2, the direction of the swing is reverse in the output signals of the differential amplifiers A1 and A2 to that of the swing as explained in the former assumption of the input offset voltage, so that the idling current is largely decreased, thereby cutting the output stage transistors Q1 and Q2 off in an extreme case.

Figure 2:
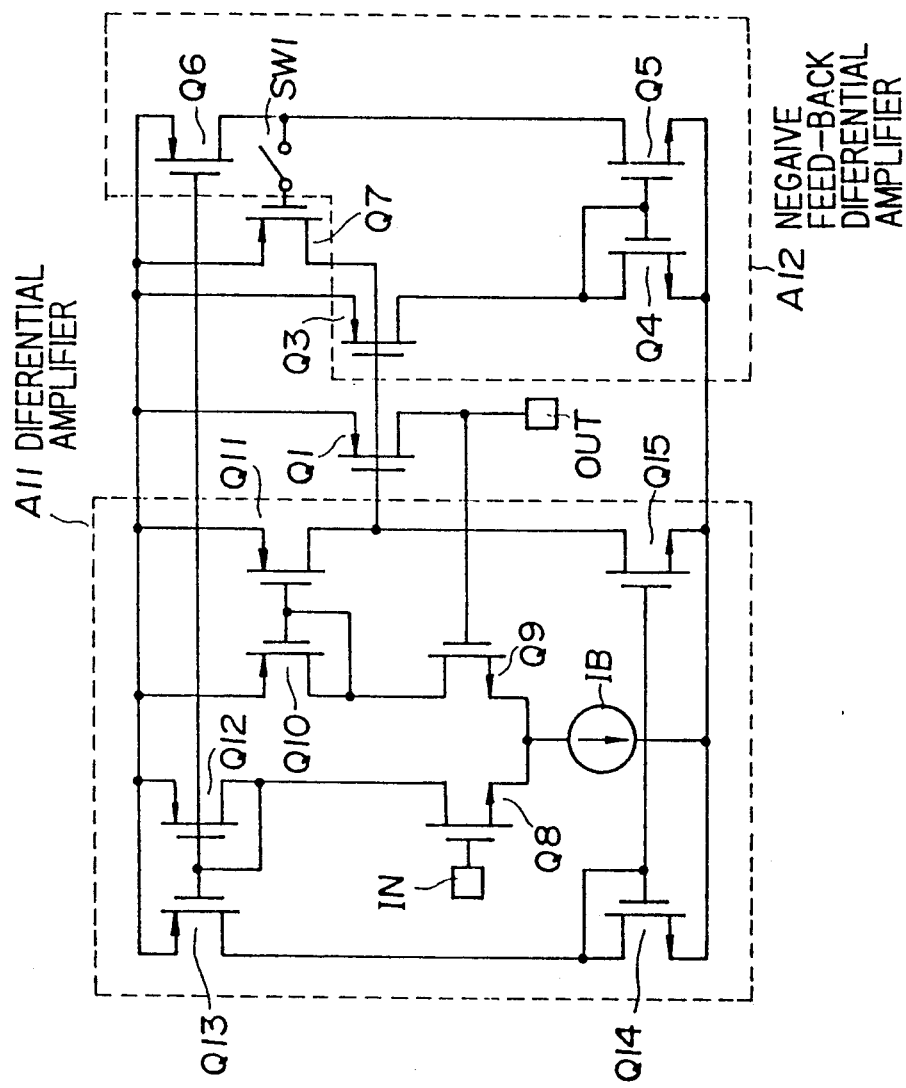
FIG. 2 is a circuit diagram of a second conventional amplifying circuit.

In order to overcome this disadvantage, the aforementioned second conventional amplifying circuit is proposed as shown in FIG. 2.

FIG. 2 shows circuit portions corresponding to the differential amplifier A1 and the transistor Q1 of FIG. 1, respectively. In this amplifying circuit, a differential amplifier A11 is composed of transistors Q8 to Q15 including a current source IB, and a differential amplifier A12 is composed of transistors Q3 to Q6. An output of the differential amplifier A11 is connected to an output stage transistor Q1 which is connected to an output terminal OUT, and to the transistor Q3 of the differential amplifier A12. Additionally, a transistor Q7 is provided to be connected at a gate to a node of drains of the transistors Q5 and Q6 by a switch SW1.

In the second conventional amplifying circuit, a difference is made in the differential amplifier A12 between a gate to source voltage of the output stage transistors Q1 and a gate to source voltage of the transistor Q12 through which a current equal to a current flowing through the transistor Q8 flows. As a result of this comparison, an output signal X is applied through the switch SW1 to the transistor Q7, in which the output signal X is amplified to be negatively fed back to a gate of the transistor Q3. That is, an idling current which is caused to flow through the output stage transistor Q1 by an input offset voltage applied to the differential amplifier A11 is compensated by the negative feed-back amplifier A12 composed of the transistors Q3 to Q7.

At the time of no load (no signal), the switch SW1 is turned on, so that the idling current flowing through the transistor Q1 is controlled. On the other hand, the switch SW1 is turned off at the time of driving a load, so that no control of the idling current is carried out. At the load driving state, a current supplied to a load flows through the output stage transistor Q1 to generate a large gate to source voltage of this transistor Q1. In such a case, if the switch SW1 is turned on, the negative feed-back amplifier A12 tends to stop the operation of the output stage transistor Q1 for driving a load. This is reason why the switch SW1 is turned off at the time of driving a load.

In the second conventional amplifying circuit, however, the idling current is determined at the time of no load by amplification factors of the differential amplifier A11 and the negative feed-back amplifier A12 and an input offset voltage of the differential amplifier A11, so that it is difficult to control the idling current with a predetermined precision due to the presence of plural control parameters. In addition, two negative feed-back paths consisting of a first feed-back path from the output stage transistor Q1 to the differential amplifier A11 and a second feed-back path locally established from the transistor Q7 to the output stage transistor Q1 are provided therein, so that it is difficult to deal with design requirements such as the distribution of amplification factors of the amplifiers A11 and A12, the compensation of phases, the systematic generation of an input offset voltage, etc.

Next, an amplifying circuit of a first preferred embodiment according to the invention will be explained in FIGS. 3 and 4.

Figure 3:
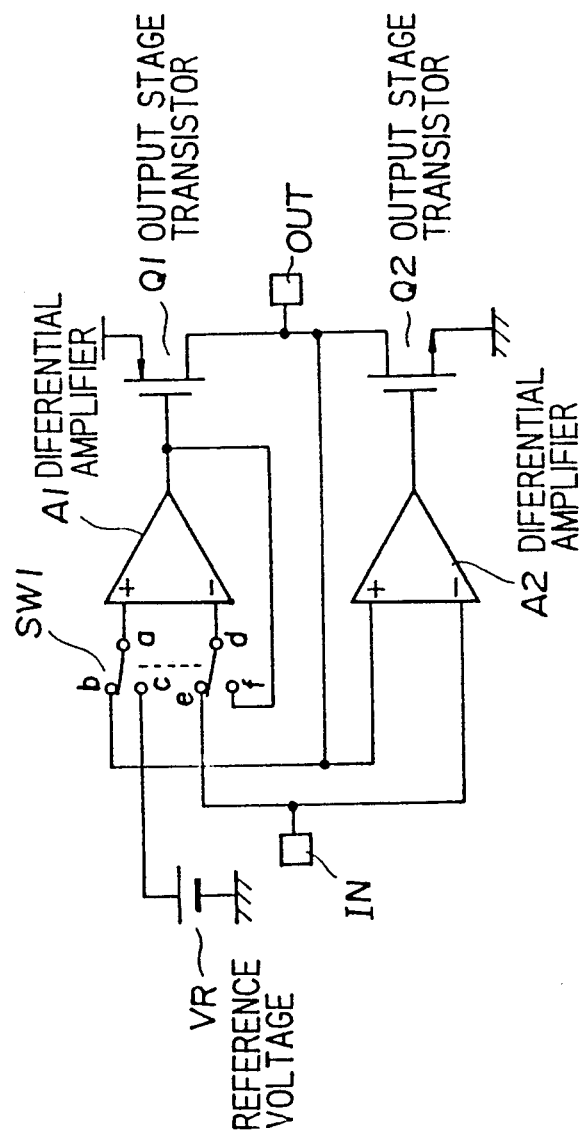
FIG. 3 is a circuit diagram explaining principle of an amplifying circuit of a first preferred embodiment according to the invention.

FIG. 3 shows the principle of the amplifying circuit, wherein like parts are indicated by like reference numerals as used in FIG. 1. In this amplifying circuit, a switch SW1 having terminals a, b and c, and d, e and f is provided on the input side of the differential amplifier A1, wherein the terminals a and d are connected to the non-inverted input and the inverted input of the differential amplifier A1, respectively, the terminal b is connected to the output terminal OUT, the terminal c is connected to a reference voltage VR, the terminal e is connected to the input terminal IN, and the terminal f is connected to an output of the differential amplifier A1.

At the time of driving a load, the terminals a and d are turned on the terminals b and d, respectively, so that operation is carried out in the same manner as in FIG. 1.

At the time of no load, the terminals a and b are turned on the terminals c and f, respectively. Consequently, a feed-back circuit including the differential amplifier A1 becomes a voltage follower having an input of the reference voltage VR, so that the output stage transistor Q1 is applied at the gate with the reference voltage VR to function as a constant current source. For this structure, an idling current flowing through the output stage transistors Q1 and Q2 is arbitrarily controlled in its value with a predetermined precision by a value of the reference voltage VR.

Figure 4A:
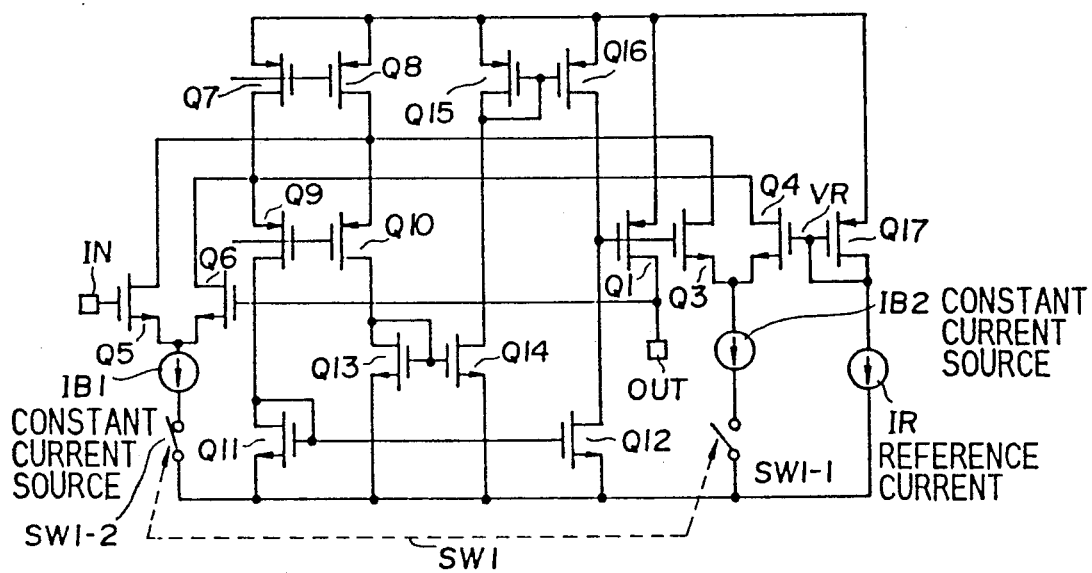
FIGS. 4A and 4B are circuit diagrams of an amplifying circuit of the first preferred embodiment.

FIG. 4A shows a portion of the amplifying circuit of FIG. 3 excluding the differential amplifier A2 and the output stage transistor Q2, wherein the switch SW1 is shown as including switches SW1-1 and SW1-2 linked to each other to be turned in the ON and OFF manner.

In operation of driving a load, the switch SW1-1 is turned off, and the switch SW1-2 is turned on, so that a differential amplifier composed of transistors Q5 to Q16 and the output stage transistor Q1 only operate. In this state, the output stage transistor Q1 functions as a power transistor for driving a load.

In operation of driving no load, the switch 1-1 is turned on, and the switch 1-2 is turned off. In this no load mode, a circuit composed of transistors Q1 to Q4 and Q7 to Q17 operate, wherein a voltage follower having the output stage transistor Q1 applied at the gate with the reference voltage VR is formed. In this circuit, the output stage transistor Q1 functions as a constant current source.

Here, if it is assumed that a ratio of sizes between the transistors Q1 and Q17 is "n", a current of "n x IR" flows through the output stage transistor Q1, where "IR" is a reference current, as shown in FIG. 4A. At this time, a voltage of the output terminal OUT is equal to a voltage applied to the input terminal IN in cooperation with the differential amplifier A2 and the output stage transistor Q2 as explained in FIG. 3.

In the circuit of FIG. 4A, a current flowing through the output stage transistors Q1 and Q2 (FIG. 3) is precisely controlled at the time of no load, so that the increase of a current consumption and the cut-off of the output stage transistors are avoided. Further, there is no existence of a local feed-back circuit, although it is formed in the aforementioned conventional amplifying circuit. Accordingly, amplification factors and phase compensation are easily determined in designing an amplifying circuit of the invention, because the circuit design can be carried out separately between the ON states of the switches SW1-1 and SW1-2.

Figure 4B:
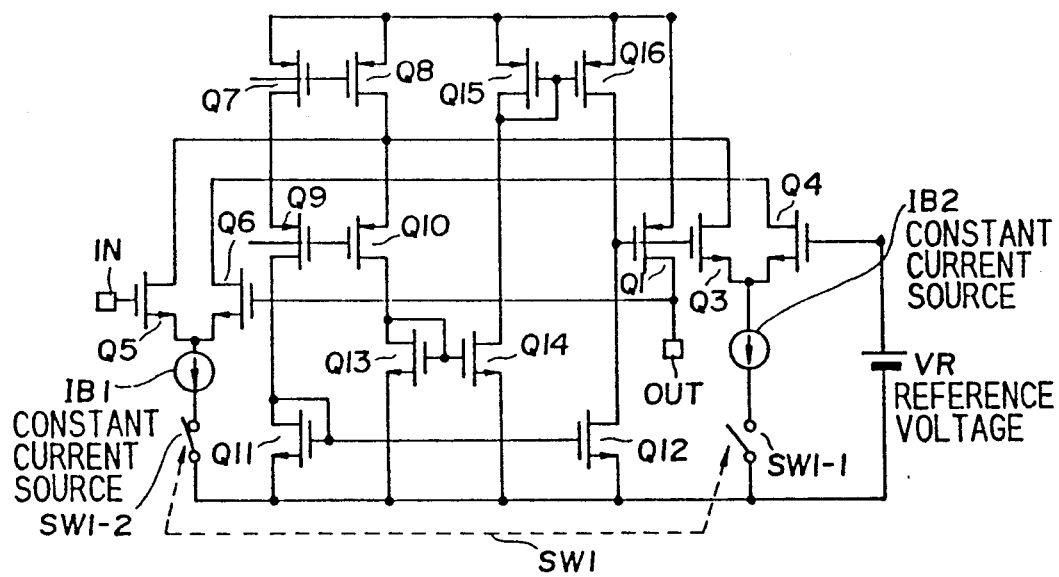

The transistor Q17, the reference current IR, and the reference voltage VR of FIG. 4A may be explained as shown in FIG. 4B.

Figure 5:
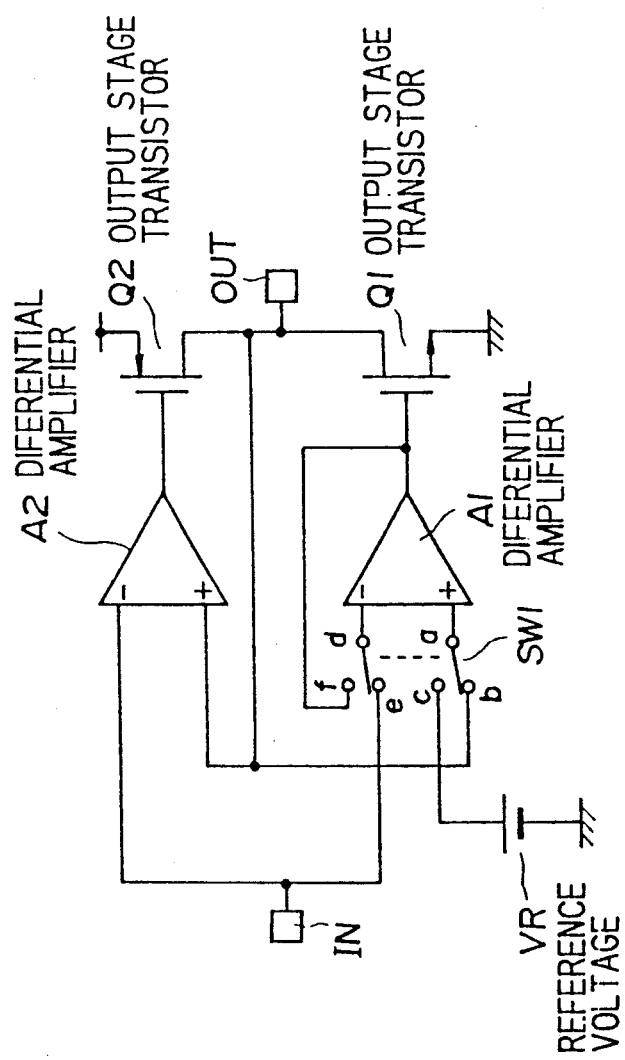
FIG. 5 is a circuit diagram explaining principle of an amplifying circuit of a second preferred embodiment according to the invention.

FIG. 5 shows an amplifying circuit of a second preferred embodiment according to the invention, wherein the output stage transistor Q is N type, and the output stage transistor Q2 is P type, although the output stage transistors Q1 and Q2 are P type and N type, respectively, in the first preferred embodiment.

Figure 6:
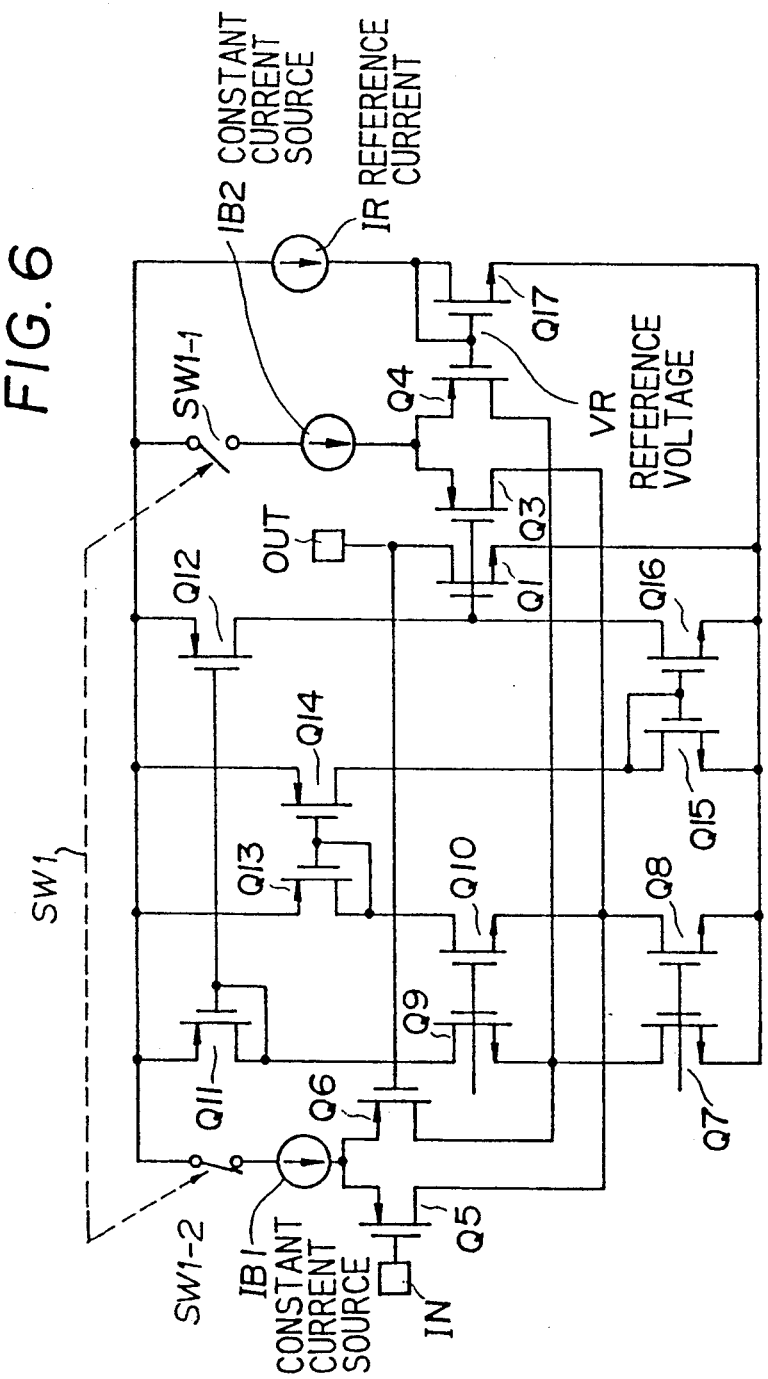
FIG. 6 is a circuit diagram of an amplifying circuit of the second preferred embodiment.

FIG. 6 shows a portion of the amplifying circuit of the second preferred embodiment excluding the differential amplifier A2 and the output stage transistor Q2 as shown in FIG. 5, wherein like parts are indicated by like reference numerals as used in FIG. 4A.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. An amplifying circuit, comprising:
   a first differential amplifier having an inverted input connected to an input terminal and a non-inverted input connected to an output terminal;
   a first output stage transistor connected at a gate to an output of said first differential amplifier, at a source to a power supply, and at a drain to said output terminal;
   a second differential amplifier having an inverted input connected to said input terminal and a non-inverted input terminal connected to said output terminal;
   a second output stage transistor connected at a gate to an output of said differential amplifier, at a source to ground, and at a drain to said output terminal;
   first switching means for switching a connection of said non-inverted input of said first differential amplifier from said output terminal to a reference voltage source; and
   second switching means for switching a connection of said inverted input of said first differential amplifier from said input terminal to said output of said first differential amplifier.

2. An amplifying circuit, according to claim 1, wherein:
   said first and second switching means switch said connections of said non-inverted and inverted inputs of said first differential amplifier to said reference voltage source and said output of said first differential amplifier, respectively, at a time of driving no load.

3. An amplifying circuit, according to claim 1, wherein:
   said first output stage transistor is of P channel type; and
   said second output stage transistor is of N channel type.

4. An amplifying circuit, comprising:
   a first differential amplifier having an inverted input connected to an input terminal and a non-inverted input connected to an output terminal;
   a first output stage transistor connected at a gate to an output of said first differential amplifier, at a source to a power supply, and at a drain to said output terminal;
   a second differential amplifier having an inverted input connected to said input terminal and a non-inverted input terminal connected to said output terminal;
   a second output stage transistor connected at a gate to an output of said second differential amplifier, at a source to ground, and at a drain to said output terminal;
   a first switching means for switching a connection of said non-inverted input of said second differential amplifier from said output terminal to a reference voltage source; and
   a second switching means for switching a connection of said inverted input of said second differential amplifier from said input terminal to said output of said second differential amplifier.

5. An amplifying circuit, according to claim 4, wherein:
   said first and second switching means switch said connections of said non-inverted and inverted inputs of said second differential amplifier to said reference voltage source and said output of said second differential amplifier, respectively, at a time of driving no load.

6. An amplifying circuit, according to claim 4, wherein:
   said first output stage transistor is of P channel type;
   said second output stage transistor is of N channel type.

* * * * *